(12) United States Patent
Gambino et al.

(10) Patent No.: US 7,781,267 B2
(45) Date of Patent: Aug. 24, 2010

(54) ENCLOSED NANOTUBE STRUCTURE AND METHOD FOR FORMING

(75) Inventors: Jeffrey Peter Gambino, Westford, VT (US); Son Van Nguyen, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 726 days.

(21) Appl. No.: 11/419,329

(22) Filed: May 19, 2006

(65) Prior Publication Data
US 2010/0187502 A1 Jul. 29, 2010

(51) Int. Cl.
*H01L 21/82* (2006.01)
(52) U.S. Cl. ............... 438/128; 438/196; 438/272; 438/400; 257/499; 257/E51.04; 257/E39.008; 257/E23.074; 257/E23.165; 257/E21.27
(58) Field of Classification Search .............. 257/400, 257/E21.27, E51.04; 438/128, 196, 272, 438/400
See application file for complete search history.

(56) References Cited

U.S. PATENT DOCUMENTS

| | | | |
|---|---|---|---|
| 6,515,339 B2 | 2/2003 | Shin et al. | |
| 6,803,260 B2 | 10/2004 | Shin et al. | |
| 6,913,994 B2* | 7/2005 | Guo et al. | 438/638 |
| 2002/0014667 A1 | 2/2002 | Shin et al. | |
| 2002/0167374 A1 | 11/2002 | Hunt et al. | |
| 2004/0119127 A1 | 6/2004 | Anazawa et al. | |
| 2005/0037547 A1* | 2/2005 | Bertin et al. | 438/142 |
| 2005/0074926 A1* | 4/2005 | Bertin et al. | 438/129 |
| 2005/0191495 A1 | 9/2005 | Rueckes et al. | |

OTHER PUBLICATIONS

Ward, et al.; A Non-Volatile Nanoelectromechanical Memory Element Utilizing a Fabric of Carbon Nanotubes; 0-7803-8726-0/04; (C) 2004 IEEE; pp. 34-38.

* cited by examiner

*Primary Examiner*—Davienne Monbleau
*Assistant Examiner*—Farid Khan
(74) *Attorney, Agent, or Firm*—Schmeiser, Olsen & Watts; Michael J. LeStrange (57) ABSTRACT

A semiconductor device and associated method for forming. The semiconductor device comprises an electrically conductive nanotube formed over a first electrically conductive member such that a first gap exists between a bottom side the electrically conductive nanotube and a top side of the first electrically conductive member. A second insulating layer is formed over the electrically conductive nanotube. A second gap exists between a top side of the electrically conductive nanotube and a first portion of the second insulating layer. A first via opening and a second via opening each extend through the second insulating layer and into the second gap.

19 Claims, 10 Drawing Sheets

# ENCLOSED NANOTUBE STRUCTURE AND METHOD FOR FORMING

BACKGROUND OF THE INVENTION

1. Technical Field

The present invention relates to a semiconductor device comprising an enclosed nanotube structure.

2. Related Art

Devices formed on electrical structures are typically not protected from external elements that may cause the devices to malfunction. Thus, there is a need for a structure and associated method for protecting devices formed on electrical structures from external elements.

SUMMARY OF THE INVENTION

The present invention provides a semiconductor device, comprising:

a substrate;

a first electrically conductive member formed on a first portion of said substrate;

a first insulating layer formed on a second portion of said substrate;

an electrically conductive nanotube formed over said first insulating layer and over said first electrically conductive member such that a first gap exists between a bottom side of said electrically conductive nanotube and a top side of said first electrically conductive member, wherein said electrically conductive nanotube is adapted to be activated such that said electrically conductive nanotube is electrically connected to said first electrically conductive member;

a second electrically conductive member formed over said first insulating layer and in electrical contact with said electrically conductive nanotube;

a third electrically conductive member formed over said first insulating layer and in electrical contact with said electrically conductive nanotube;

a second insulating layer formed over said second electrically conductive member, said third electrically conductive member, and said electrically conductive nanotube, wherein a second gap exists between a top side of said electrically conductive nanotube and a first portion of said second insulating layer, wherein a first via opening extends through said second insulating layer and into said second gap, and wherein a second via opening extends through said second insulating layer and into said second gap; and a third insulating layer formed over said second layer, said first via opening, and said second via opening.

The present invention provides a method for forming a semiconductor device, comprising:

providing a substrate;

forming a structure on a first portion of said substrate, said structure comprising a first layer of mandrel material formed over a first electrically conductive member;

forming a first insulating layer on a second portion of said substrate;

forming an electrically conductive nanotube over said first insulating layer and said first layer of removable material;

forming a second electrically conductive member, a third electrically conductive member, and a mandrel structure over said first insulating layer and in electrical contact with said electrically conductive nanotube, said second electrically conductive member in electrical contact with said electrically conductive nanotube in an opposite location from said third electrically conductive member, each of said second electrically conductive member, said third electrically conductive member, and said mandrel structure formed from said mandrel material;

forming a second insulating layer over said second electrically conductive member, said third electrically conductive member, said mandrel structure, and said electrically conductive nanotube, forming a first via opening and a second via opening extending through said second insulating layer and over said mandrel structure; and removing said mandrel structure and said first layer of mandrel material such that first gap exists between a bottom side of said electrically conductive nanotube and a top side of said first electrically conductive member and a second gap exists between a top side of said electrically conductive nanotube and a first portion of said second insulating layer, wherein said first via opening extends into said second gap, and wherein said second via opening extends into said second gap; and forming a third insulating layer over said second layer, said first via opening, and said second via opening.

The present invention advantageously provides a structure and associated method for protecting devices formed on electrical structures from external elements.

DETAILED DESCRIPTION OF THE INVENTION

FIGS. 1A-1L illustrate and detail stages in a fabrication process of a semiconductor structure 2, in accordance with embodiments of the present invention. The semiconductor structure 2 illustrated in FIGS. 1A-1L is a cross sectional view. The fabrication process described with respect to FIGS. 1A-1L illustrates the formation of a non-volatile electro/mechanical memory structure (e.g., a nanotube random access memory (NRAM) structure) comprising an enclosed nanotube structure 20 within the semiconductor structure 2 (see completed semiconductor structure 2 in FIG. 1L).

Figure 1A:
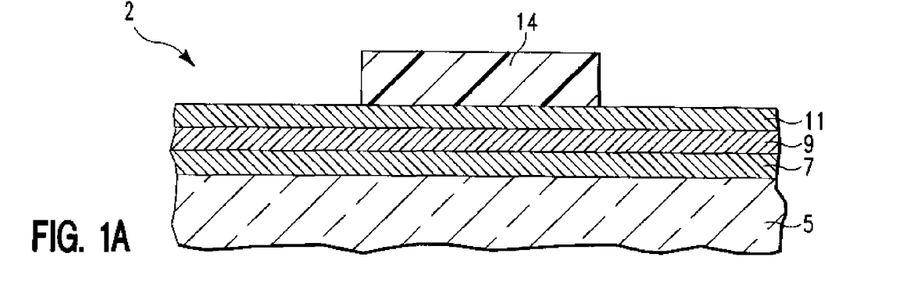
FIG. 1A, illustrates semiconductor structure provided for fabrication process, in accordance with embodiments of the present invention.

In FIG. 1A, the semiconductor structure 2 is provided for the fabrication process, in accordance with embodiments of the present invention. The semiconductor structure 2 comprises a substrate 5 with a first electrode layer 7 formed over the substrate 5, a second electrode layer 9 formed over the first electrode layer 7, a mandrel layer 11 formed over the second electrode layer 9, and a photo resist layer 14 formed over the mandrel layer 11. The substrate 5 may comprise any type of dielectric material used for insulating a semiconductor device known to a person of ordinary skill in the art including, inter alia, a silicon dioxide substrate, a fluorinated silicon dioxide substrate, a silicon glass substrate, etc. The first electrode layer 7 may comprise any type of electrode material known to a person of ordinary skill in the art including, inter alia, titanium, etc. The second electrode layer 9 may comprise any type of electrode material known to a person of ordinary skill in the art including, inter alia, Pd, Cr, Ti, etc. The mandrel layer 11 may comprise, inter alia, Al, W, Ge, polyimide, Si, etc. Each of the first electrode layer 7, the second electrode layer 9, and the mandrel layer 11 may be formed by any deposition process including, inter alia, a physical vapor deposition (PVD) process, a chemical vapor deposition (CVD) process, a spin-on deposition process, etc.

Figure 1B:
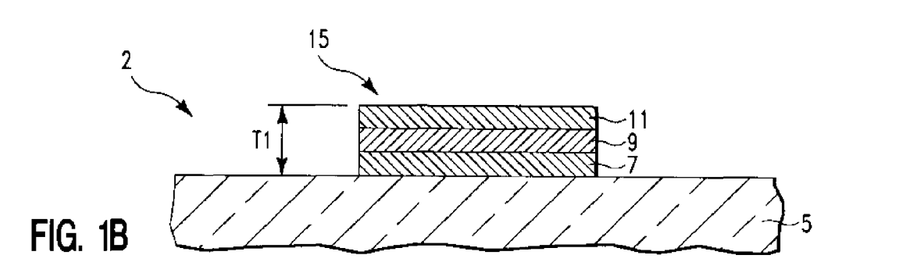
FIG. 1B illustrates the semiconductor structure of FIG. 1A after an electrode structure is formed, in accordance with embodiments of the present invention.

FIG. 1B illustrates the semiconductor structure 2 of FIG. 1A after an electrode structure 15 is formed, in accordance with embodiments of the present invention. The electrode structure 15 comprises a thickness T1 that may be selected from a range of about of about 160 nm to about 650 nm. The electrode structure 15 comprises portions of the first electrode layer 7, the second electrode layer 9, and the mandrel layer 11 that remain after a standard photo resist process is used to create a pattern by photolithography and transferring the pattern to the first electrode layer 7, the second electrode layer 9, and the mandrel layer 11 by a reactive ion etch process using a standard fluorine-containing RIE chemistry. Portions of the first electrode layer 7, the second electrode layer 9, and the mandrel layer 11 are stripped away (i.e., to create electrode structure 15) using standard techniques known to a person of ordinary skill in the art.

Figure 1C:
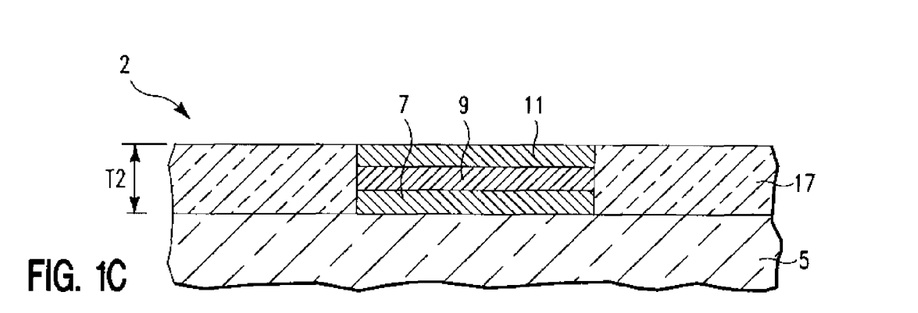
FIG. 1C illustrates the semiconductor structure of FIG. 1B after a dielectric layer has been formed (or deposited) over a substrate, in accordance with embodiments of the present invention.

FIG. 1C illustrates the semiconductor structure 2 of FIG. 1B after a dielectric layer 17 has been formed (or deposited) over the substrate 5, in accordance with embodiments of the present invention. The dielectric layer 17 may be deposited in a thickness T2 that is greater than or equal to the thickness T1 of the electrode structure 15. The dielectric layer 17 may be deposited by any process including, inter alia, a CVD process. The dielectric layer 17 may be planarized using, inter alia, a chemical mechanical polishing (CMP) process that stops on the mandrel layer 11. The dielectric layer 17 may comprise, inter alia, silicon dioxide, FSG, SiCOH, a polymer material, etc.

Figure 1D:
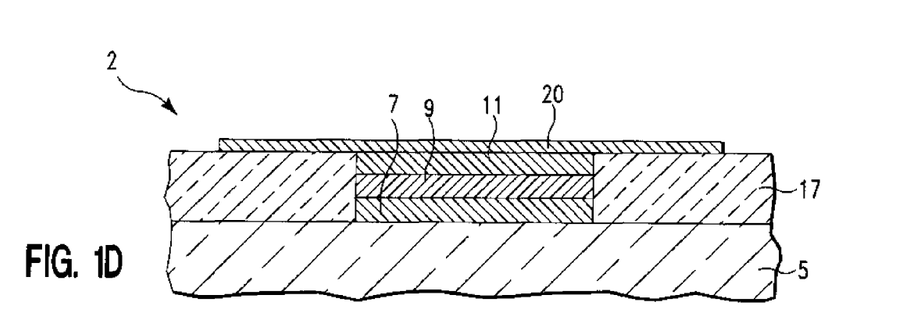
FIG. 1D illustrates the semiconductor structure of FIG. 1C after a nanotube structure has been deposited (and patterned) over a dielectric layer, in accordance with embodiments of the present invention.

FIG. 1D illustrates the semiconductor structure 2 of FIG. 1C after a nanotube structure 20 has been deposited (and patterned) over the dielectric layer 17 and the electrode structure 15, in accordance with embodiments of the present invention. The nanotube structure 20 may be deposited using, inter alia, a spin-on deposition process and patterned using a lithography and RIE (e.g., with an $O_2$ based plasma) process. The nanotube structure 20 may be, inter alia, a carbon nanotube structure.

Figure 1E:
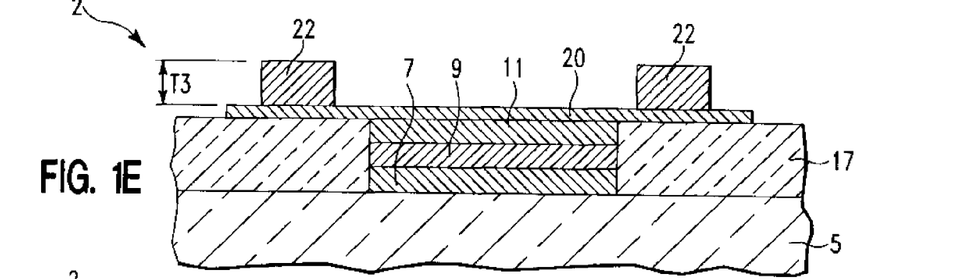
FIG. 1E illustrates the semiconductor structure of FIG. 1D after a resist layer has been deposited (and patterned) over portions of the nanotube structure, in accordance with embodiments of the present invention.

FIG. 1E illustrates the semiconductor structure 2 of FIG. 1D after a resist layer 22 has been deposited (and patterned) over portions of the nanotube structure 20, in accordance with embodiments of the present invention. The resist layer 22 may be deposited in a thickness T3 of about 200 nm. The resist layer 22 may be patterned using, inter alia, a lithography process, a lithography process with a dry etch or wet etch, etc. As an alternative, the resist layer 22 may be a spin-on dielectric layer comprising, inter alia, a polyimide material, a polymer dielectric material, hydrogen silsesquioxane (HSQ), methyl silsesquioxane (MSQ), etc.

Figure 1F:
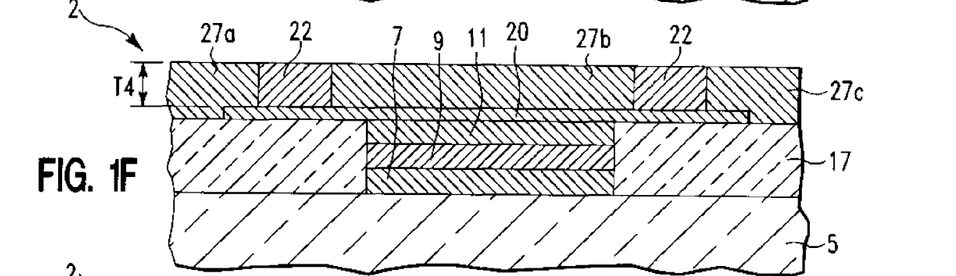
FIG. 1F illustrates the semiconductor structure of FIG. 1E after a mandrel layer has been deposited over the nanotube structure, in accordance with embodiments of the present invention.

FIG. 1F illustrates the semiconductor structure 2 of FIG. 1E after a mandrel layer 27 has been deposited over the nanotube structure 20 and the dielectric layer 17, in accordance with embodiments of the present invention. The mandrel layer 27 comprises an upper mandrel 27b, an electrode structure 27a, and an electrode structure 27c. The mandrel layer 27 may comprise, inter alia, aluminum, tungsten, etc. The mandrel layer 27 may comprise a thickness T4 that is greater than or equal to about 200 nm (i.e. at least as thick as the thickness T3 of the resist layer 22). The mandrel layer 27 may be patterned (i.e., to form the upper mandrel 27b, the electrode structure 27a, and the electrode structure 27c) by a CMP process.

Figure 1G:
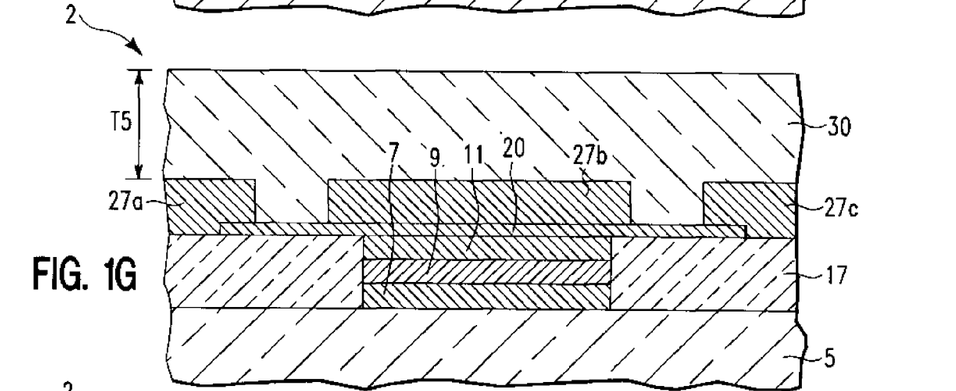
FIG. 1G illustrates the semiconductor structure of FIG. 1F after the resist layer has been stripped away and a dielectric layer has been deposited, in accordance with embodiments of the present invention

FIG. 1G illustrates the semiconductor structure 2 of FIG. 1F after the resist layer 22 has been stripped away and a dielectric layer 30 has been deposited over the upper mandrel 27b, the electrode structure 27a, the electrode structure 27c, and the nanotube structure 20, in accordance with embodiments of the present invention. The dielectric layer 30 may comprise a thickness T5 of about 500 nm. The dielectric layer 30 may comprise, inter alia, silicon dioxide, etc. The dielectric layer 30 may be deposited using a CVD process and planarized using a CMP process.

Figure 1H:
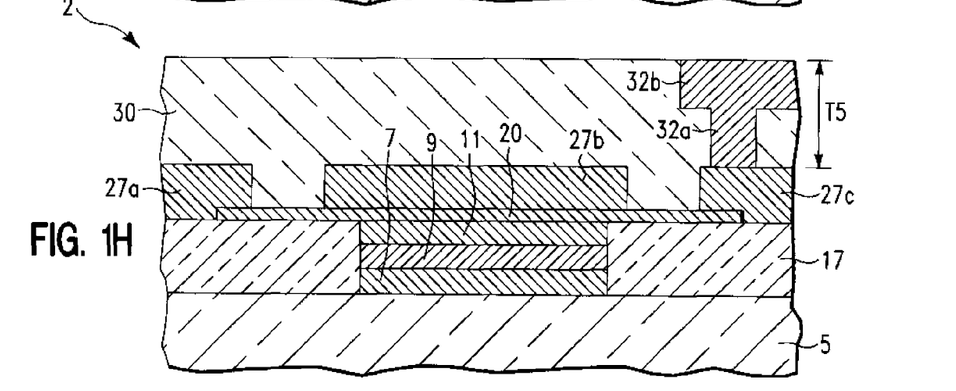
FIG. 1H illustrates the semiconductor structure of FIG. 1G after a copper via interconnect structure and a copper wire has been formed, in accordance with embodiments of the present invention

FIG. 1H illustrates the semiconductor structure 2 of FIG. 1G after a copper via interconnect structure 32a and a copper wire 32b has been formed over the electrode structure 27c, in accordance with embodiments of the present invention. The copper via interconnect structure 32a electrically connects the electrode structure 27c to the copper wire 32b. The copper via interconnect structure 32a and the copper wire 32b may be formed using any technique known to a person of ordinary skill in the art including, inter alia, a dual damascene process.

Figure 1I:
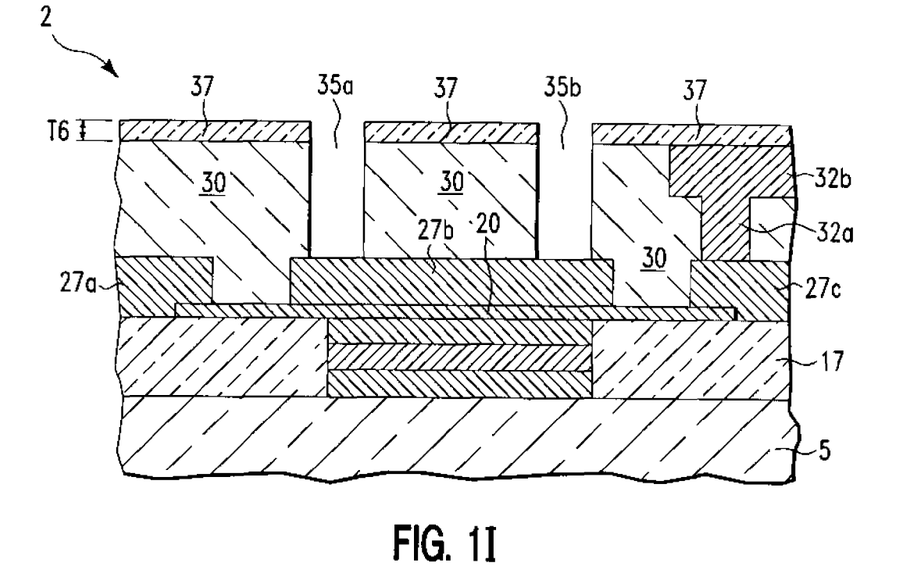
FIG. 1I illustrates the semiconductor structure of FIG. 1H after a dielectric layer has been deposited, in accordance with embodiments of the present invention.

FIG. 1I illustrates the semiconductor structure 2 of FIG. 1H after a dielectric layer 37 has been deposited over the dielectric layer 30 and the copper via interconnect structure 32a and mandrel removal via openings 35a and 35b have been formed, in accordance with embodiments of the present invention. The dielectric layer 37 may comprise, inter alia, SiN, SiC, SiCN, SiCON, etc. The dielectric layer 37 may be deposited by a CVD process and comprise a thickness T6 of about 50 nm. The mandrel removal via openings 35a and 35b may be formed using a lithography process and a RIE process.

Figure 1J:
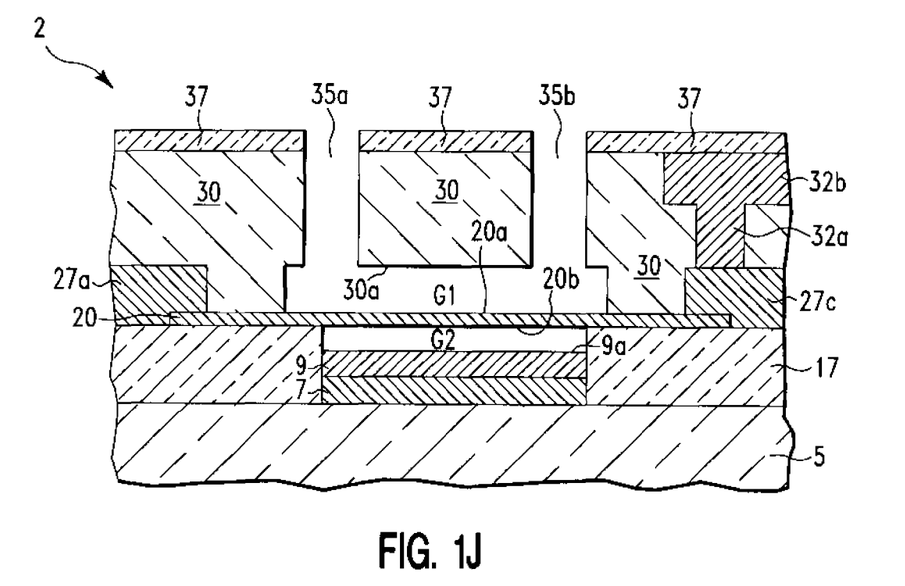
FIG. 1J illustrates the semiconductor structure of FIG. 1I after the upper mandrel and the mandrel layer have been removed, in accordance with embodiments of the present invention.

FIG. 1J illustrates the semiconductor structure 2 of FIG. 1I after the upper mandrel 27b and the mandrel layer 11 have been removed, in accordance with embodiments of the present invention. The upper mandrel 27b and the mandrel layer 11 may be removed by using a wet etch process applied through mandrel removal via openings 35a and 35b. The wet etch process may comprise any type of wet etch process including, inter alia, a hydrochloric acid wet etch process, a hydrogen peroxide wet etch process, etc. The removed upper mandrel 27b creates a gap G1 between a top surface 20a of the nanotube structure 20 and a bottom surface 30a of the dielectric layer 30. The removed mandrel layer 11 creates a gap G2 between a bottom surface 20b of the nanotube structure 20 and a top surface 9a of the second electrode layer 9. The mandrel removal via openings 35a and 35b extend through the dielectric layer 37, the dielectric layer 30, and into the gap G1. Note that the mandrel removal via openings 35a and 35b are not located directly over the nanotube structure 20 (see the top view semiconductor structure 2 in the FIGS. 3A and 3B).

Figure 1K:
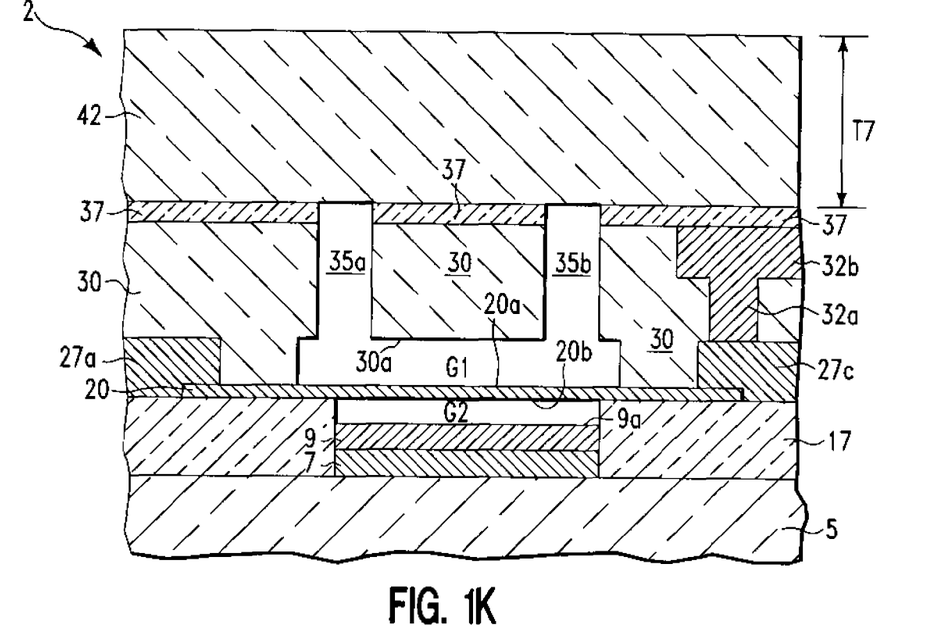
FIG. 1K illustrates the semiconductor structure of FIG. 1J after a dielectric layer has been deposited the mandrel removal via openings 35a and 35b, in accordance with embodiments of the present invention.

FIG. 1K illustrates the semiconductor structure 2 of FIG. 1J after a dielectric layer 42 has been deposited over the dielectric layer 37 and the mandrel removal via openings 35a and 35b, in accordance with embodiments of the present invention. The dielectric layer 42 may comprise silicon dioxide comprising a thickness T7 of about 50 nm. The dielectric layer 42 may be deposited using a non-conformal CVD process. The dielectric layer 42 provides an air tight seal for the mandrel removal via openings 35a and 35b, the gap G1, and the gap G2 thereby creating an encapsulated (i.e., within a cavity comprising via openings 35a and 35b, the gap G1, and the gap G2) nanotube structure 20 within the semiconductor structure 2. The enclosed nanotube structure 40 is protected from any external (i.e., external to the semiconductor device 2) particles or moisture that could damage the nanotube structure 20.

Figure 1L:
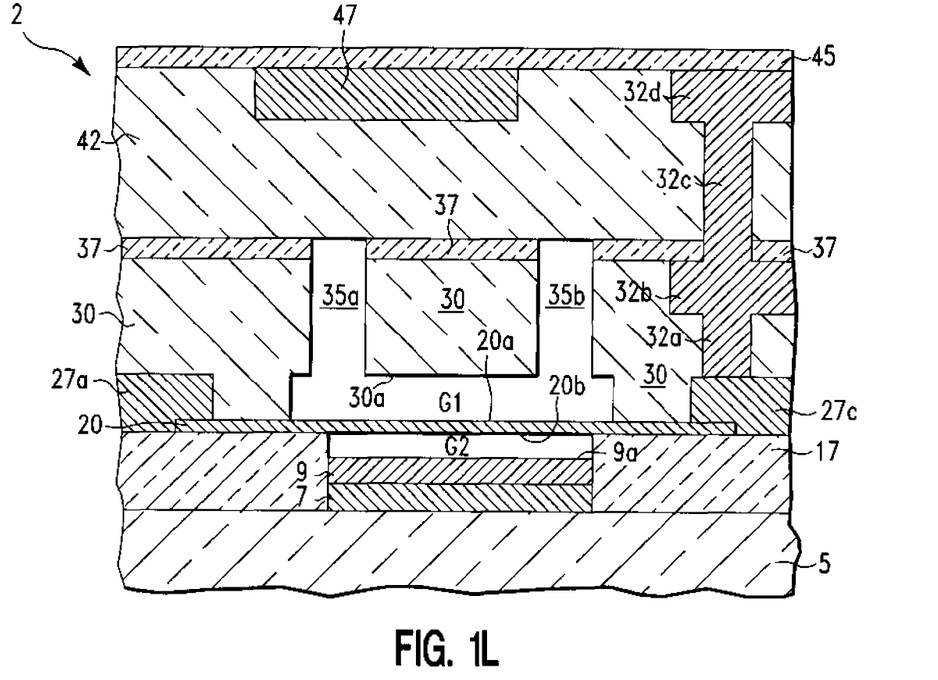
FIG. 1L illustrates the semiconductor structure of FIG. 1K after a copper via interconnect structure 32c, a copper wire 32d, and a copper wire 47 has been formed, in accordance with embodiments of the present invention.

FIG. 1L illustrates the semiconductor structure 2 of FIG. 1K after a copper via interconnect structure 32c, a copper wire 32d, and a copper wire 47 has been formed within the dielectric layer 42 and a dielectric layer 45 has been formed over the dielectric layer 42, in accordance with embodiments of the present invention. The semiconductor structure 2 of FIG. 1L represents a portion of a non-volatile electro/mechanical memory structure (e.g., a nanotube random access memory (NRAM) structure) comprising an enclosed nanotube structure 22. An NRAM structure comprises an array of nanotube structures (e.g., see nanotube structure 22). Each nanotube structure is electrically connected to two electrode structures (e.g., see electrode structures 27a and 27c) and spans a gap (e.g., see gap G2) or is suspended above a contact electrode structure (e.g., see electrode structure 9). The contact electrode structure comprises an applied voltage. When there is no electrical field (e.g., a voltage) applied to the two electrode structures (e.g., see electrode structures 27a and 27c), the nanotube structure is not activated and therefore remains straight as illustrated in FIG. 1L. The nanotube structure remaining straight as illustrated in FIG. 1L, does not electrically contact the contact electrode structure (e.g., see electrode structure 9) and therefore a logical 0 or off state is represented in the NRAM. When an electrical field (e.g., a voltage) is applied to the two electrode structures (e.g., see electrode structures 27a and 27c), the nanotube structure becomes activated and bends in a direction 50 (e.g., see FIG. 1M) resulting in an electrical connection between the nanotube structure and the contact electrode structure (e.g., see electrode structure 9) and therefore a logical 1 or on state is represented in the NRAM and the electrical field is removed from the two electrode structures. The nanotube structure remains bent and connected to the contact electrode structure (e.g., see electrode structure 9) until an electrical field (e.g., a voltage) is again applied to the two electrode structures. The aforementioned process represents the operation of a random access memory (NRAM) structure.

Figure 1M:
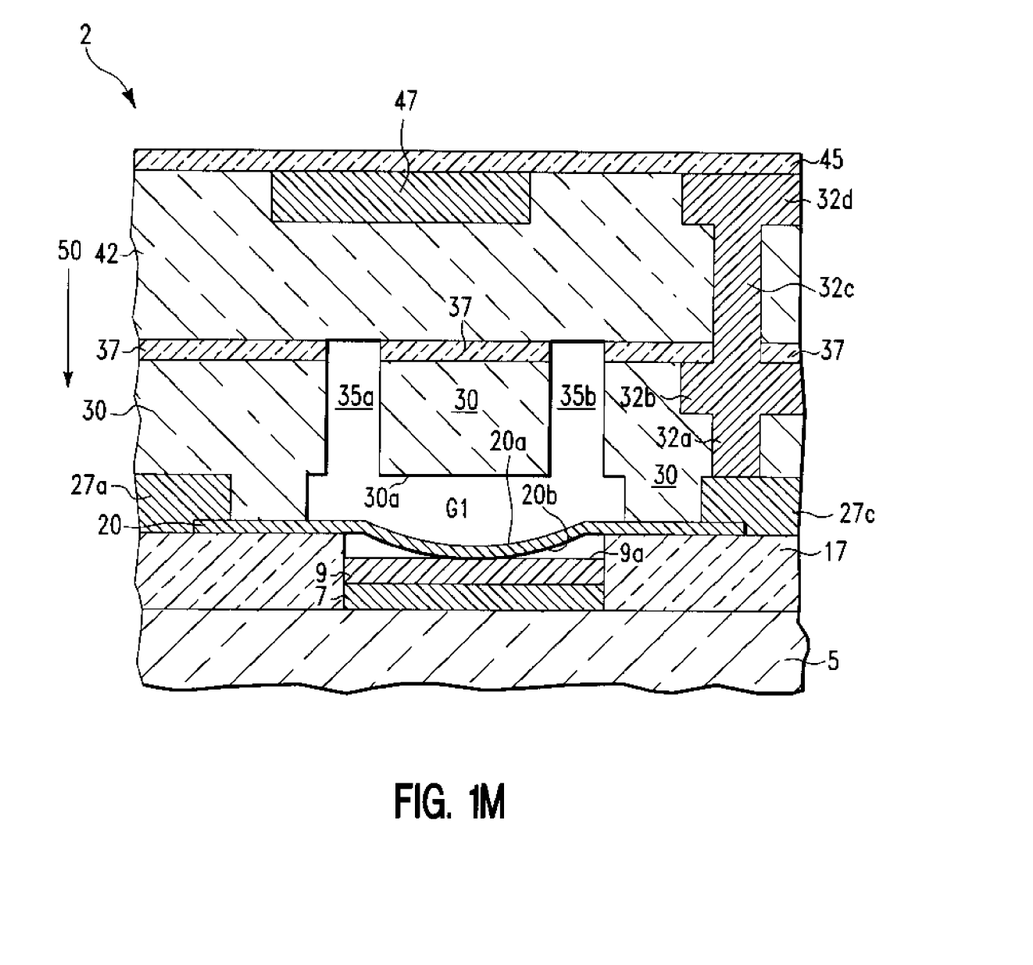
FIG. 1M illustrates the semiconductor structure of FIG. 1L after an electrical field has been applied to electrode structures, in accordance with embodiments of the present invention.

FIG. 1M illustrates the semiconductor structure 2 of FIG. 1L after an electrical field (e.g., a voltage) has been applied to electrode structures 27a and 27c, in accordance with embodiments of the present invention. In FIG. 1M, the nanotube structure 20 has become activated and bends in a direction 50 resulting in an electrical connection between the nanotube structure and the electrode structure 9. The electrical connection between the nanotube structure and the electrode structure 9 represents a logical 1 in the NRAM.

FIGS. 2A-2L illustrates an alternative fabrication process from the fabrication process of FIGS. 1A-1L, in accordance with embodiments of the present invention. FIGS. 2A-2L detail stages in a fabrication process of a semiconductor structure 2a The semiconductor structure 2 illustrated in FIGS. 2A-2L is a cross sectional view. The fabrication process for FIGS. 2A-2G comprises a same fabrication process as described with respect to FIGS. 1A-1G.

Figure 2A:
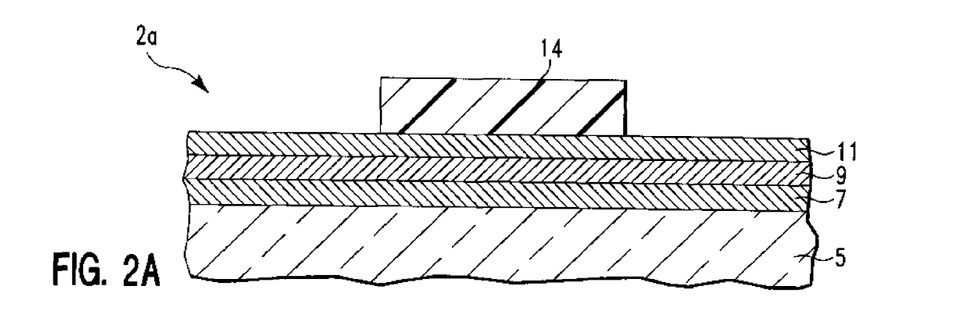
FIGS. 2A-2L illustrate an alternative fabrication process from the fabrication process of FIGS. 1A-1L, in accordance with embodiments of the present invention.
Figure 2B:
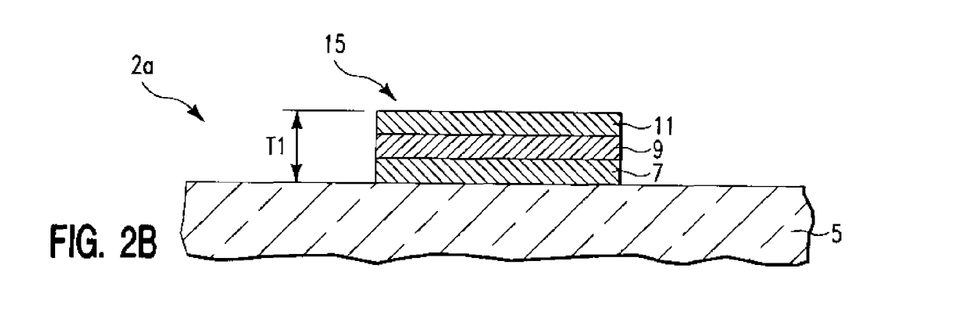
Figure 2C:
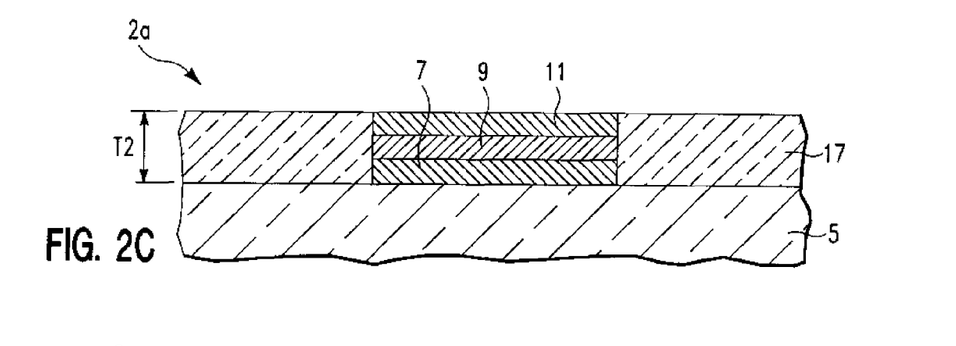
Figure 2D:
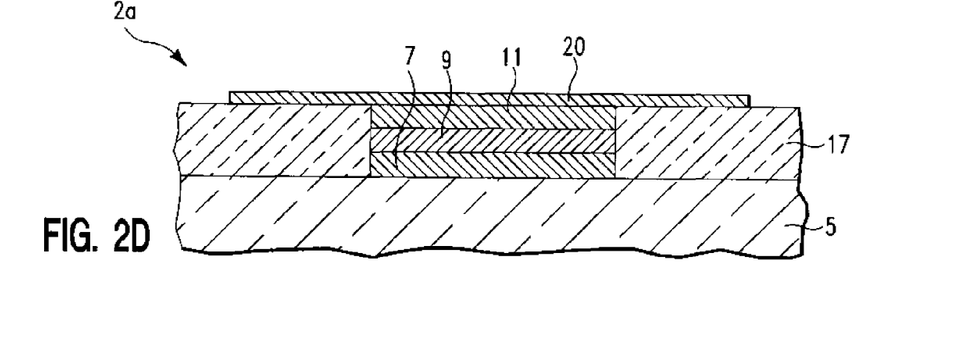
Figure 2E:
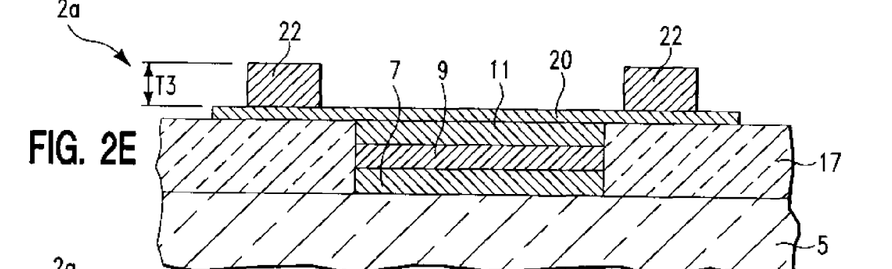
Figure 2F:
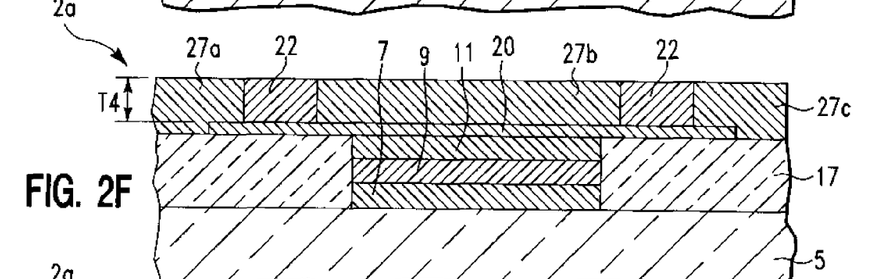
Figure 2G:
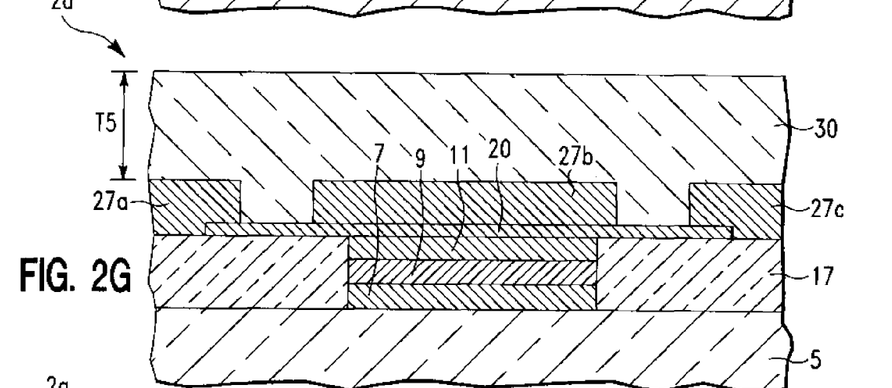
Figure 2H:
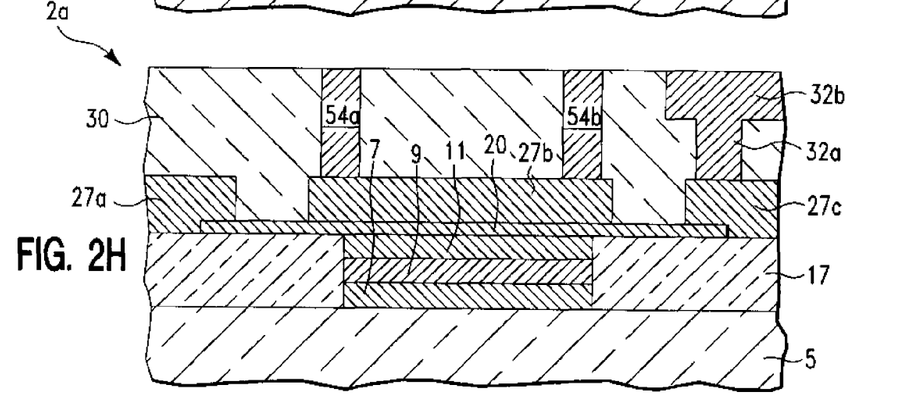

FIG. 2H illustrates the semiconductor structure 2a of FIG. 2G after a copper via interconnect structure 32a and a copper wire 32b has been formed over the electrode structure 27c and electrically conductive vias 54a and 54b have been formed over the upper mandrel 27b, in accordance with embodiments of the present invention. The copper via interconnect structure 32a electrically connects the electrode structure 27c to the copper wire 32b. The copper via interconnect structure 32a, the copper wire 32b, and the electrically conductive vias 54a and 54b may be formed using any technique known to a person of ordinary skill in the art including, inter alia, a damascene process.

Figure 2I:
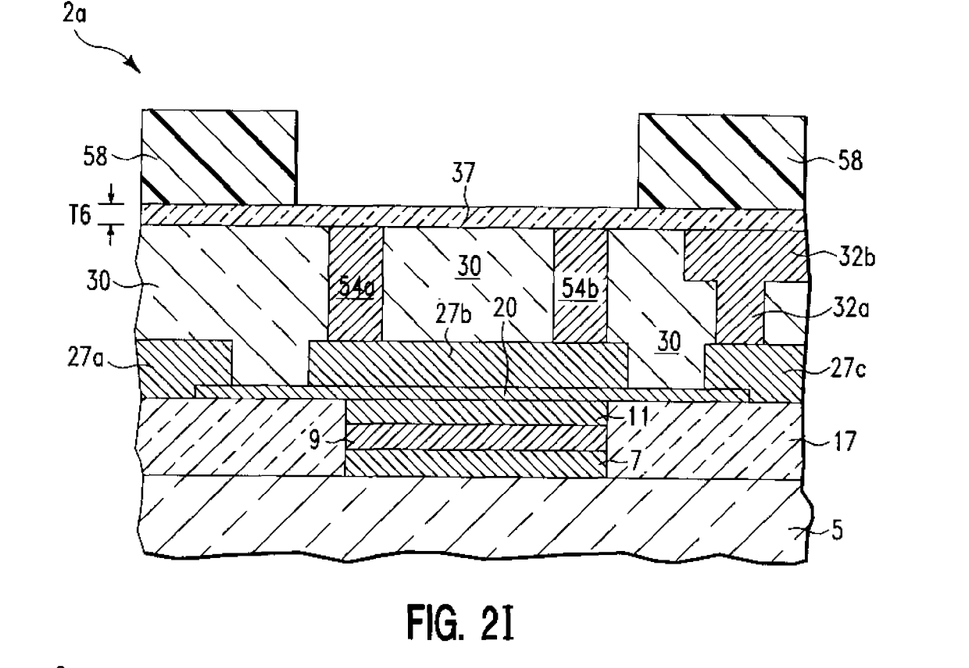

FIG. 2I illustrates the semiconductor structure 2a of FIG. 2H after a dielectric layer 37 has been deposited over the dielectric layer 30 and a photo resist layer 58 has been formed over portions of the dielectric layer 37, in accordance with embodiments of the present invention. The dielectric layer 37 may comprise, inter alia, silicon nitride. The dielectric layer 37 may be deposited by a CVD process and comprise a thickness T6 of about 50 nm.

Figure 2J:
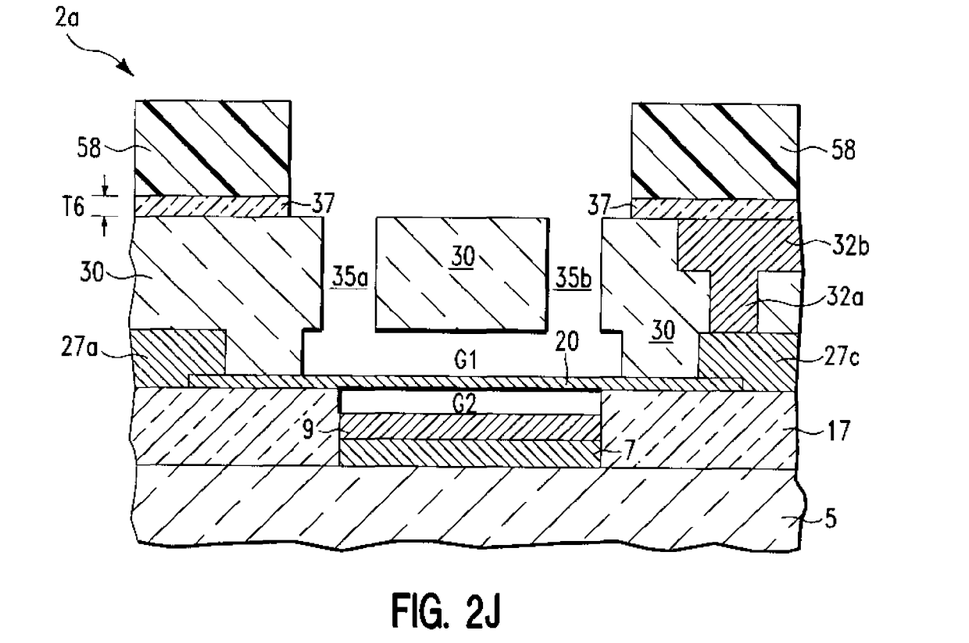

FIG. 2J illustrates the semiconductor structure 2a of FIG. 2I after mandrel removal via openings 35a and 35b have been formed, a portion of the dielectric layer 37 has been removed, and the upper mandrel 27b and the mandrel layer 11 have been removed, in accordance with embodiments of the present invention. The mandrel removal via openings 35a and 35b may be formed using a lithography process and a RIE process to remove a portion of dielectric layer 37 and electrically conductive vias 54a and 54b. The upper mandrel 27b and the mandrel layer 11 may be removed by using a wet etch process applied through mandrel removal via openings 35a and 35b. The wet etch process may comprise any type of wet etch process including, inter alia, a hydrochloric acid wet etch process, a hydrogen peroxide wet etch process, etc. The removed upper mandrel 27b creates a gap G1 between a top surface 20a of the nanotube structure 20 and a bottom surface 30a of the dielectric layer 30. The removed mandrel layer 11 creates a gap G2 between a bottom surface 20b of the nanotube structure 20 and a top surface 9a of the second electrode layer 9. The mandrel removal via openings 35a and 35b extend through the dielectric layer 30 and into the gap G1.

Figure 2K:
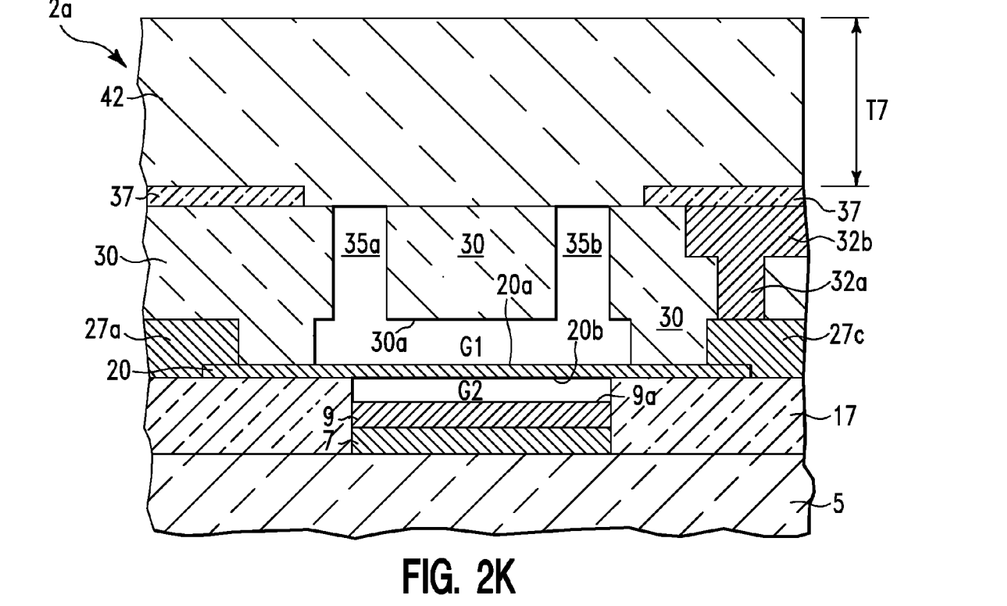

FIG. 2K illustrates the semiconductor structure 2a of FIG. 2J after a dielectric layer 42 has been deposited over the remaining portions of the dielectric layer 37 and the mandrel removal via openings 35a and 35b, in accordance with embodiments of the present invention. The dielectric layer 42 may comprise silicon dioxide comprising a thickness T7 of about 50 nm. The dielectric layer 42 may be deposited using a CVD process. The dielectric layer 42 provides an air tight seal for the mandrel removal via openings 35a and 35b, the gap G1, and the gap G2 thereby creating an encapsulated (i.e., within a cavity comprising via openings 35a and 35b, the gap G1, and the gap G2) nanotube structure 20 within the semiconductor structure 2. The enclosed nanotube structure 20 is protected from any external (i.e., external to the semiconductor device 2a) particles or moisture that could damage the nanotube structure 20.

Figure 2L:
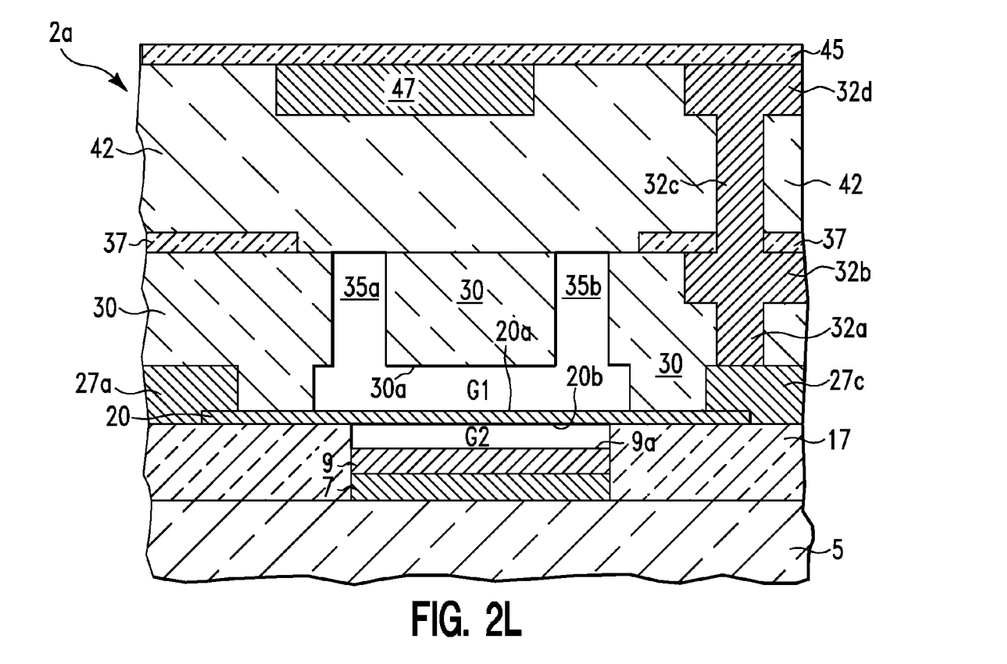

FIG. 2L illustrates the semiconductor structure 2a of FIG. 2K after a copper via interconnect structure 32c, a copper wire 32d, and a copper wire 47 has been formed within the dielectric layer 42 and a dielectric layer 45 has been formed over the dielectric layer 42, in accordance with embodiments of the present invention. The semiconductor structure 2a of FIG. 2L represents a portion of a non-volatile electro/mechanical memory structure (e.g., a nanotube random access memory (NRAM) structure) comprising an enclosed nanotube structure 20.

Figure 3A:
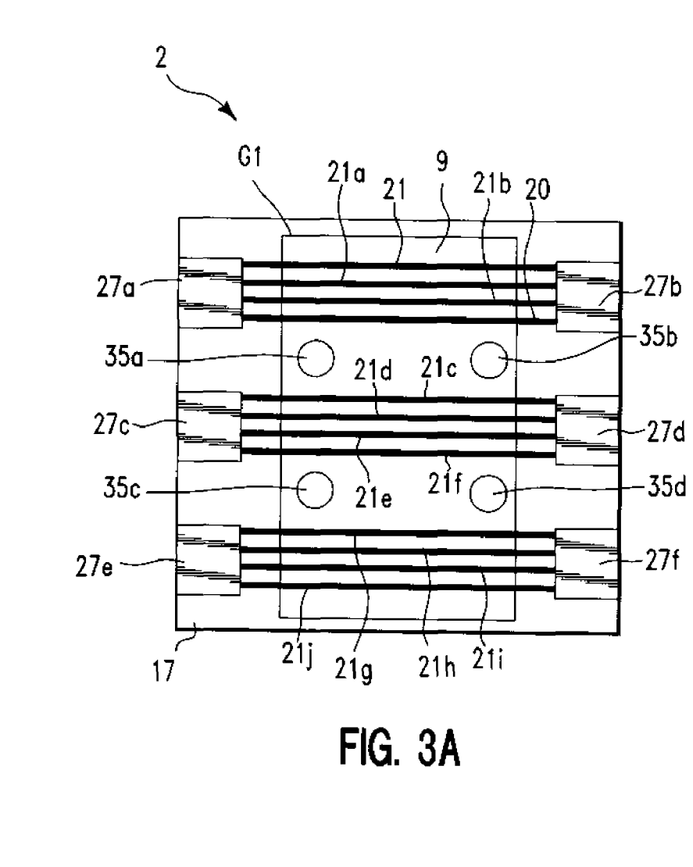
FIG. 3A illustrates a top view of the semiconductor structure of FIGS. 1J and 2J, in accordance with embodiments of the present invention.

FIG. 3A illustrates a top view of the semiconductor structure 2 of FIGS. 1J and 2J, in accordance with embodiments of the present invention. The top view of the semiconductor structure 2 in FIG. 3A illustrates the mandrel removal via openings 35a and 35b in locations that is not directly over the nanotube structure 20. Additionally, FIG. 3A illustrates a plurality of nanotube structures 21a . . . 21j and additional mandrel removal via openings 35c and 35d that comprise a same structure and method of forming as the nanotube structure 20 and the mandrel removal via openings 35a and 35b, respectively. The Gap G1 is located between a top surface (e.g., top surface 20a of the nanotube structure 20) of each of the nanotube structures 20 and 21a . . . 21j and a bottom surface 30a of the dielectric layer 30.

Figure 3B:
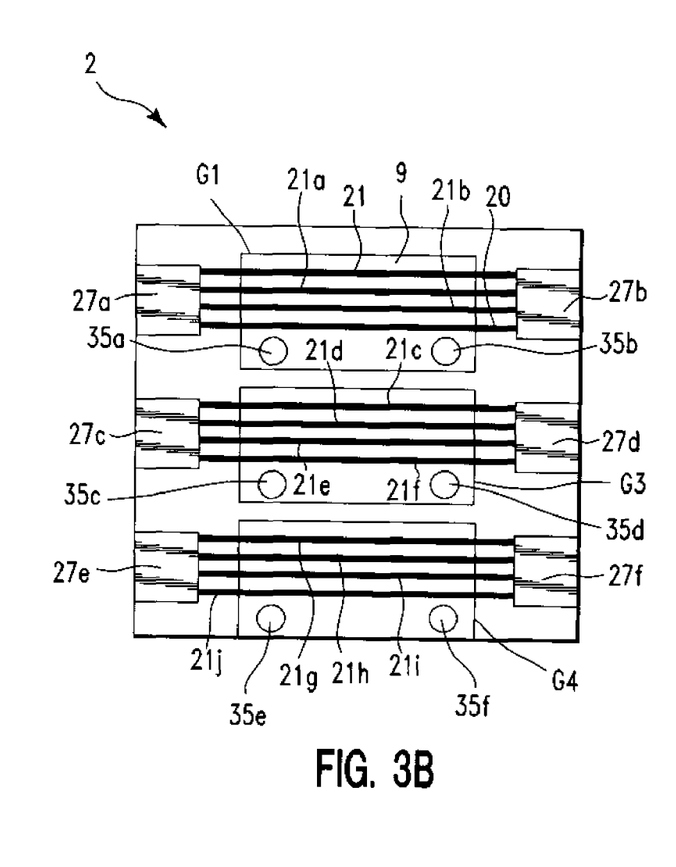
FIG. 3B illustrates an alternative top view to the top view of FIG. 3A, in accordance with embodiments of the present invention

FIG. 3B illustrates an alternative top view to the top view of FIG. 3A, in accordance with embodiments of the present invention. In contrast to FIG. 3A, the semiconductor device of FIG. 3B comprises 3 individual gaps G1, G3, and G4 instead of one gap (i.e., gap G1 of FIG. 3A) and additional mandrel removal via openings 35e and 35f.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor device, comprising:
a substrate;
a first electrically conductive member formed on a first portion of said substrate;
a first insulating layer formed on a second portion of said substrate;
an electrically conductive nanotube formed over said first insulating layer and over said first electrically conductive member such that a first gap exists between a bottom side of said electrically conductive nanotube and a top side of said first electrically conductive member, wherein said electrically conductive nanotube is adapted to be activated such that said electrically conductive nanotube is electrically connected to said first electrically conductive member;
a second electrically conductive member formed over said first insulating layer and in electrical and mechanical contact with a first side of said electrically conductive nanotube and a second side of said electrically conductive nanotube, wherein said first side of said electrically conductive nanotube differs from said second side of said electrically conductive nanotube, and wherein said first side of said electrically conductive nanotube is perpendicular to said second side of said electrically conductive nanotube;
a third electrically conductive member formed over said first insulating layer and in electrical and mechanical contact with said first side of said electrically conductive nanotube and a third side of said electrically conductive nanotube, and wherein said third side of said electrically conductive nanotube differs from said first side of said electrically conductive nanotube and said second side of said electrically conductive nanotube, and wherein said first side of said electrically conductive nanotube is perpendicular to said third side of said electrically conductive nanotube;
a second insulating layer formed over said second electrically conductive member, said third electrically conductive member, and said electrically conductive nanotube, wherein a second gap exists between a top side of said electrically conductive nanotube and a first independent portion of said second insulating layer, wherein a first via opening extends through said second insulating layer and into said second gap such that said first via separates said first independent portion of said second insulating layer from a second independent portion of said second insulating layer, wherein a second via opening extends through said second insulating layer and into said second gap such that said second via separates said first independent portion of said second insulating layer from a third independent portion of said second insulating layer, wherein the second gap extends horizontally and parallel to said top side of said nanotube, wherein the second gap extends within said second independent portion and said third independent portion, wherein said first via extends vertically and perpendicular to said top side of said nanotube, wherein said second via extends vertically and perpendicular to said top side of said nanotube, wherein said first portion of said second insulating layer exists between and in contact with said first via and said second via such that a first vertical side of said first portion of said second insulating layer is in contact with said first via and a second vertical side of said first portion of said second insulating layer is in contact with said second via; and
a third insulating layer formed over said second insulating layer, said first via opening, and said second via opening.

2. The semiconductor device of claim 1, further comprising:

a fourth insulating layer formed between a section of said second insulating layer and a section of said third insulating layer.

3. The semiconductor device of claim 2, wherein said first via opening further extends through said fourth insulating layer, and wherein said second via opening further extends through said fourth insulating layer.

4. The semiconductor device of claim 2, wherein said fourth insulating layer comprises silicon nitride.

5. The semiconductor device of claim 2, wherein said fourth insulating layer does not extend over said first via opening and said second via opening.

6. The semiconductor device of claim 1, wherein each of said substrate, said first insulating layer, said second insulating layer, and said third insulating layer comprises silicon dioxide.

7. The semiconductor device of claim 1, wherein said electrically conductive nanotube is encapsulated within a cavity formed by said first electrically conductive member, said first insulating layer, and said second insulating layer.

8. The semiconductor device of claim 1, wherein said second insulating layer comprises a thickness of at least about 50 nm.

9. The semiconductor device of claim 1, wherein said electrically conductive nanotube, said first electrically conductive member, said second electrically conductive member, and said third electrically conductive member in combination form a non-volatile memory device.

10. The semiconductor device of claim 1, wherein said electrically conductive nanotube comprises a carbon nanotube.

11. A method for forming a semiconductor device, comprising:
providing a substrate;
forming a structure on a first portion of said substrate, said structure comprising a first layer of mandrel material formed over a first electrically conductive member;
forming a first insulating layer on a second portion of said substrate;
forming an electrically conductive nanotube over said first insulating layer and said first layer of removable material;
forming a second electrically conductive member, a third electrically conductive member, and a mandrel structure over said first insulating layer and in electrical contact with said electrically conductive nanotube, wherein said second electrically conductive member is in electrical contact with said electrically conductive nanotube in an opposite location from said third electrically conductive member, wherein each of said second electrically conductive member, said third electrically conductive member, and said mandrel structure formed from said mandrel material, wherein said second electrically conductive member is in electrical and mechanical contact with a first side of said electrically conductive nanotube and a second side of said electrically conductive nanotube, wherein said first side of said electrically conductive nanotube differs from said second side of said electrically conductive nanotube, wherein said first side of said electrically conductive nanotube is perpendicular to said second side of said electrically conductive nanotube, wherein said third electrically conductive member is in electrical and mechanical contact with said first side of said electrically conductive nanotube and a third side of said electrically conductive nanotube, wherein said third side of said electrically conductive nanotube differs from said first side of said electrically conductive nanotube and said second side of said electrically conductive nanotube, and wherein said first side of said electrically conductive nanotube is perpendicular to said third side of said electrically conductive nanotube;

forming a second insulating layer over said second electrically conductive member, said third electrically conductive member, and said electrically conductive nanotube, wherein a second gap exists between a top side of said electrically conductive nanotube and a first independent portion of said second insulating layer, wherein a first via opening extends through said second insulating layer and into said second gap such that said first via separates said first independent portion of said second insulating layer from a second independent portion of said second insulating layer, wherein a second via opening extends through said second insulating layer and into said second gap, such that said second via separates said first independent portion of said second insulating layer from a third independent portion of said second insulating layer, wherein said first via extends vertically and perpendicular to said top side of said nanotube, wherein said second via extends vertically and perpendicular to said top side of said nanotube, wherein said first portion of said second insulating layer exists between and in contact with said first via and said second via such that a first vertical side of said first portion of said second insulating layer is in contact with said first via and a second vertical side of said first portion of said second insulating layer is in contact with said second via; and removing said mandrel structure and said first layer of mandrel material such that first gap exists between a bottom side of said electrically conductive nanotube and a top side of said first electrically conductive member and a second gap exists between a top side of said electrically conductive nanotube and a first portion of said second insulating layer, wherein the second gap extends horizontally and parallel to said top side of said nanotube, wherein the second gap extends within said second independent portion and said third independent portion, wherein said first via opening extends into said second gap, and wherein said second via opening extends into said second gap; and forming a third insulating layer over said second layer, said first via opening, and said second via opening.

12. The method of claim 11, further comprising:
forming a fourth insulating layer over a section of said second insulating layer, wherein said fourth insulating layer is formed before said third insulating layer is formed, and wherein said fourth insulating layer exists between a section of said third insulating layer and said section of said second insulating layer.

13. The method of claim 12, wherein said forming said first via opening and said second via opening further comprises extending said first via opening and said second via opening through said fourth insulating layer.

14. The method of claim 12, wherein said fourth insulating layer does not extend over said first via opening and said second via opening.

15. The method of claim 11, wherein said forming said second electrically conductive member, said third electrically conductive member, and said mandrel structure comprises the use of a damascene process.

16. The method of claim 11, wherein said removing said mandrel structure and said first layer of mandrel material results in said electrically conductive nanotube being encapsulated within a cavity formed by said first electrically conductive member, said first insulating layer, and said second insulating layer.

17. The method of claim 11, wherein said removing said mandrel structure and said first layer of mandrel material comprises the use of a wet etch process applied through said first via opening and said second via opening.

18. The semiconductor device of claim 1, further comprising a fifth insulating layer formed over said third insulating layer, wherein said third insulating layer comprises a first copper wire formed within a top surface of said third insulating layer, wherein said fifth insulating layer is in mechanical contact with said first copper wire, and wherein said electrically conductive nanotube is not formed within said first insulating layer.

19. The semiconductor device of claim 1, wherein said second insulating layer is in mechanical contact with a first side of said second electrically conductive member and a second side of said second electrically conductive member, wherein said first side of said second electrically conductive member differs from said second side of said second electrically conductive member, wherein said second insulating layer is in mechanical contact with a first side of said third electrically conductive member and a second side of said third electrically conductive member, and wherein said first side of said third electrically conductive member differs from said second side of said third electrically conductive member.

* * * * *